ULTRACOMPACT MODULAR STRUCTURE FOR LOW COST MOUNTING AND INTERCONNECTION OF ELECTRONIC COMPONENTS

Filed Feb. 15, 1967

LESTER D. ALEXANDER
GORDON R. STAYBOLDT
INVENTORS.

BY William T. O'Neil
AGENT

United States Patent Office 3,405,324

Patented Oct. 8, 1968

3,405,324

ULTRACOMPACT MODULAR STRUCTURE FOR LOW COST MOUNTING AND INTERCONNECTION OF ELECTRONIC COMPONENTS

Lester D. Alexander, Los Angeles, and Gordon R. Stayboldt, Torrance, Calif., assignors to International Telephone and Telegraph Corporation, New York, N.Y., a corporation of Maryland Filed Feb. 15, 1967, Ser. No. 616,299

7 Claims. (Cl. 317—101)

ABSTRACT OF THE DISCLOSURE

A basic plug-in module is shown which is adapted to act as a carrier for electronic components and especially integrated circuit flat packs. Particular features are adaptability to high production techniques in which component wire leads are preformed before insertion into their places on the assembly and the ease with which flow soldering techniques are applied. Components are mounted on the connector pin side of the assembly and the opposite side is available for interconnections either for experimental type wiring or for application of preformed or printed circuit interconnections.

BACKGROUND OF THE INVENTION

*Field of the invention*

The invention relates to electronic component mounting and more particularly to modular plug-in units. The invention is most valuable in the area of miniature and microminiature electronics, especially for integrated circuit "flat-packs."

*Description of the prior art*

In the prior art, the mounting of electronic components on circuit boards has been subject to many variations. These do not lend themselves to complex "few-of-a-kind" systems since there are so many different functional types of circuit boards required and the quantity of each type is usually small. The cost saving associated with high production quantities are therefore not available in prior art configurations. The trend in such areas as electronic computers, etc., has been toward permanent installations of components on printed or etched circuit boards which are connector mounted and are still relatively expensive because of low quantities and high design cost. Moreover, such assemblies frequently must be discarded in the event of a single component failure because of their inadaptability to easy repairs.

A modular plug-in subassembly according to the present invention is much more readily repairable, especially when it is used as a preproduction item. It also lends itself to high production savings because one type of modular structure can be used throughout a system to package all or most of the circuit functions. In complex electronic systems it is usually necessary to have freedom to modify circuits until the design is "frozen." After that time, when a system is to be produced in quantity, a modular subassembly, constructed according to the present invention can be converted to printed circuit interconnection wiring and may thereafter be produced making use of the lowest cost, high production methods consistent with current technology.

Additional advantages of the present invention over the prior art lie in the simplicity of fabrication of the component mounting structure itself and in the utilization of the connector pins themselves as interconnection terminals.

SUMMARY OF THE INVENTION

In accordance with the present invention, a plug-in subassembly of electronic components may be constructed which overcomes the cost and inflexibility disadvantages or the prior art.

A flat body or base is molded, pressed or machined (from a selection of insulating materials ranging from phenolics, epoxies all the way to ceramics) to provide component mounting spaces and to accept connector pins which project above the body. The device is most useful for mounting miniature parts, particularly integrated circuit "flat-packs," which are so comparatively small that they do not project substantially above the surface of the base, thereby making it possible to mount the components on the connector side of the base. The connector pins themselves then extend through to the opposite side of the base and wire-type leads from the components are fed through openings adjacent to the pins to the opposite side of the base for attachment and interconnection. Because of the "standard" nature of the pins which act as male connectors and also as wiring terminals, minor modifications of pin configuration will adapt the general design to a number of applications.

In accordance with the foregoing and the description to follow, it is the general object of the present invention to provide a low cost modular circuit component plug-in mounting unit which is flexible in respect to circuit design change implementation and adapted to use of high production assembly and attachment methods.

BRIEF DESCRIPTION OF THE DRAWING

To illustrate the features of the present invention, drawings are provided as follows.

DESCRIPTION OF THE PREFERRED EMBODIMENT

Figures 1A, 1B:
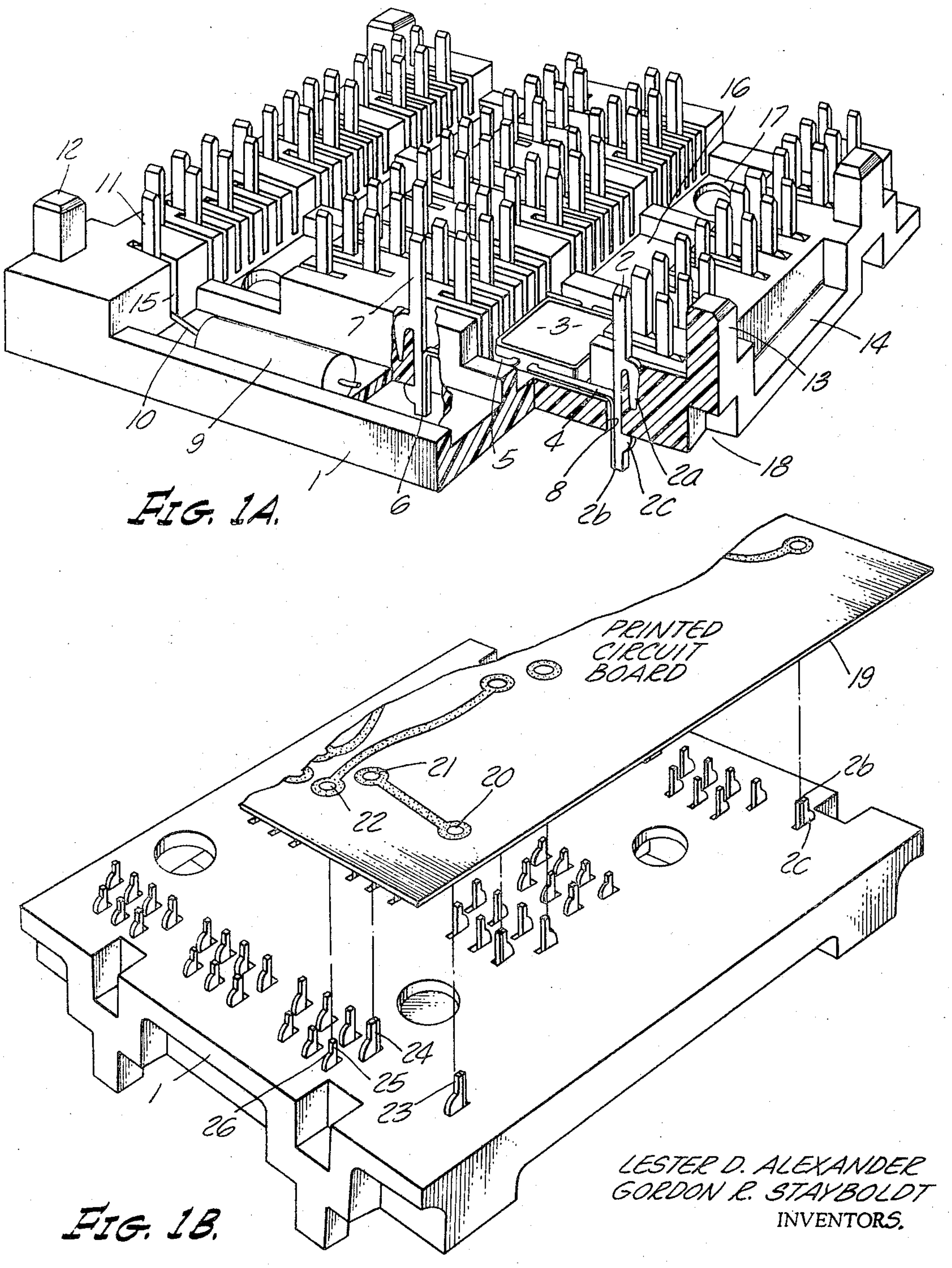
FIGURE 1A is a perspective view, partly sectioned, of the connector pin side showing the construction of a flat-pack mounting and connecting unit according to the invention.
FIGURE 1B is a perspective of the opposite side of the device of FIGURE 1A.

Referring to FIGURE 1A, it will be noted that a body or base 1 of insulating material is molded or otherwise formed into a carrier for components and connector pins. A number of connector pins, of which 2, 7, and 11 are typical, are firmly implanted in the base 1 and project substantially above the insulating material as shown. These pins are intended to engage a mating connector or corresponding mating parts of a "mother board," to provide external electrical connections. The said connector pins also project through the base and out the opposite side for a relatively short distance as will be observed looking ahead to FIGURE 1B, for purposes to be described later in this specification.

On FIGURE 1A, a partial cut-away has been drawn to show the installation of the preferred type of pin 2. This particular type of pin is installed after fabrication of the base 1 and is removable. It is also possible to implement the other features of the present invention with pins of different shapes, including pins which are permanently molded into the insulating base or body as a single step fabrication.

On close examination, the typical pin 2 will be seen to have a gripping projection 2*a* which slides into a corresponding impression in the insulating base 1 as the pin is inserted from the top side of the FIGURE 1A view. The pin is made of a strong and resilient material such as one of the beryllium coppers or bronzes and is preferably plated consistent with the environmental requirements. In the process of inserting the pin there is sufficient spring to permit it to deform by an amount sufficient to cause the latch projection 2c to slide past the body material and seat and retain itself on the underside, as illustrated. The latch projection then forms a shoulder beyond which the extreme part of the pin 2b projects. A lead accommodating opening 8 remains adjacent to the installed pin.

The particular configuration of FIGURE 1A is intended to accept six integrated circuits ("flat packs"), one of which is illustrated at 3, although the design could be adapted to more or fewer such "flat packs." For simplicity, only a few leads are shown protruding from 3, although they would ordinarily have leads extending from all four edges, each lead being attached to a corresponding pin. Two additional "flat packs" would be located at 16 or 17 and similarly, three more would be located on the opposite side of the central pin bank in the illustration.

Lead 4 is shown extending downward through opening 8, paralleling the lower extremity of pin 2, where it is available for solder or weld connection at 2b. Lead 5 is similarly connected to pin 7 at 6, etc.

In addition to the "flat packs" mounted as indicated, a typical capacitor or similar component 9 may also be mounted. The entire device can, of course, be constructed to accept more of such components, the illustration of the one at 9 being only representative. A lead 10, from 9, is shown directed toward pin 11 to which it is attached in the same manner as described for "flat pack" lead 4 at pin 2. The slots, of which 15 is typical, provide the necessary clearance for lead insertions.

Certain ancillary features of the molded shape of the body 1 provide for the practical application of the device. The upward projections, of which 12 and 13 are typical, act as guides when the assembly is plugged into a mating connector board. A number of indentations, typically 18, are provided for guides in stacking two or more of the assemblies where this is convenient from a design standpoint. The contoured extraction recess 14 would normally be matched by a similar feature on the opposite side of the assembly, thereby providing a practical way of extracting the assembly from its mating connector, either by hand, or through use of special tools for the purpose.

Referring now to FIGURE 1B, the opposite side as compared to the view of FIGURE 1A is shown. The pin arrangements are similar, as these pins extend from the insulating body 1, as hereinbefore described. It will be appreciated that the pins protruding through the insulating body in FIGURE 1B afford an ideal terminal area for making interconnections. Such interconnections can be hand wired and soldered or may be accomplished by means of flow soldering techniques, ultrasonic welding, or other known methods. The final attachment of component leads may be accomplished at the same time through use of the same method.

The inherent advantage of adaptability for hand wiring lies in the use of the invention with experimental circuitry, since changes are readily made in hand wired interconnections.

Another advantage of the present invention is its adaptability to minimum cost production methods and the ease with which a hand wired experimental configuration can be converted to the production methods. A printed circuit board 19, shown in exploded view, can readily be superimposed on the surface of FIGURE 1B. Such a board can have all preprinted interconnections joining, for example, metallic eyelets, pads or plated through holes (hereinafter referred to simply as eyelets), such as 20, 21 and 22. The placement of the eyelets is such that when the said circuit board is lowered into place the said eyelets fit over corresponding pins. Eyelets 20, 21 and 22, for example, would fit over pins 23, 24 and 25, respectively, such that the end of each pin protruded slightly through its corresponding eyelet. The shoulder, typically 26 on pin 25, provides a seat which acts to space the said circuit board from the surface of the body 1, thereby avoiding moisture entrapment. Flow soldering then provides a very satisfactory production method for making permanent electrical and mechanical connections between the circuit board and the pins themselves. The term "printed circuit board" is intended to embrace the variations including, but not limited to, etched circuit boards (whether these include deposited components or merely printed or etched wiring), having the same general appearance and equivalent functions.

Of course, modification of the pin and component pattern to fit any particular design requirement can be readily accomplished.

Various modifications and adaptations of the present invention will suggest themselves to those skilled in the art and, accordingly, it is not intended that the scope of invention should be limited to the embodiment described and illustrated.

What is claimed is:

1. A modular plug-in structure for mounting and interconnection of electronic components comprising: a flat body member formed of insulating material and having first and second opposite terminal surfaces; a plurality of elongated conductive terminals installed in said body member and extending through and projecting from both said opposite terminal surfaces, whereby said terminals projecting from said first surface, serve as connector pins when mated into a corresponding receiving connector assembly; and a plurality of openings through said body member from said first to said second surface, each of said openings being adjacent to a corresponding one of said terminals and said openings existing adjacent to at least some of said terminals whereby electronic components, including integrated circuit subassemblies having wire leads for connections, may be mounted along said first surface with said wire leads projecting through predetermined ones of said openings for connection to corresponding ones of said terminals adjacent to said second surface.

2. The invention set forth in claim 1 further defined in that said conductive terminals extend from said first surface substantially perpendicularly by an amount substantially in excess of the amount by which said components and subassemblies extend from said first surface.

3. The invention set forth in claim 1 further defined in that said wire leads and whatever interconnections are required by any specific arrangement of components and functions within a specific one of said modular plug-in structures are affixed to said terminals adjacent to said second surface, whereby they may be flow soldered along said second surface without contact with said first surface. surface.

4. The invention set forth in claim 1 in which said flat body member is a molded block of insulating material and said terminals are molded therein.

5. The invention set forth in claim 1 further defined in that said first surface is molded with predetermined indentations to receive said electronic components and subassemblies and said second surface is substantially flat.

6. The invention set forth in claim 1 further defined in that a plurality of said electronic components are mounted along said first surface in spaces among said connector pins in a manner such that said components protrude from said first surface a small distance compared to the protrusion of said connector pins, and a prefabricated printed circuit board having a plurality of metallic eyelets in a pattern substantially duplicating the pattern of at least a part of said pins projecting from said second surface, said board also having a predetermined pattern of interconnections among said eyelets, is overlaid on said second surface whereby said pins engage said eyelets and are conductively bonded thereto, thereby forming a complete plug-in subassembly.

7. The invention set forth in claim 6 in which said pins protruding from said second surface are larger in cross-section than the clearance holes in said eyelets for a portion of their protrusion from said second surface and, toward their extremities, are of cross-sectional size sufficiently small to engage the clearance holes in said eyelets, thereby to form a shoulder on each of said pins, and thereby to space said printed circuit board from said second surface.

References Cited

UNITED STATES PATENTS

| | | | |
|---|---|---|---|
| 3,227,927 | 1/1966 | Parstorfer | 339—17 XR |
| 3,234,320 | 2/1966 | Wong | 174—505 |
| 3,297,974 | 1/1967 | Pittman | 317—101 XR |
| 3,340,439 | 9/1967 | Henschen et al. | 339—17 XR |

LARAMIE B. ASKIN, *Primary Examiner.*

J. R. SCOTT, *Assistant Examiner.*